United States Patent
Rinner et al.

(10) Patent No.: US 8,129,884 B2
(45) Date of Patent: Mar. 6, 2012

(54) PIEZOELECTRIC ACTUATOR UNIT INCLUDING A CASTING COMPOUND DISPOSED IN A SLEEVE

(75) Inventors: Franz Rinner, Deutschlandsberg (AT); Herbert J. Thanner, Graz (AT); Siegfried Fellner, St. Georgen (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/831,043

(22) Filed: Jul. 6, 2010

(65) Prior Publication Data

US 2011/0057548 A1 Mar. 10, 2011

Related U.S. Application Data

(63) Continuation of application No. PCT/DE2009/000006, filed on Jan. 9, 2009.

(30) Foreign Application Priority Data

Jan. 10, 2008 (DE) .......................... 10 2008 003 821

(51) Int. Cl.
*H01L 41/08* (2006.01)
(52) U.S. Cl. ........................................ 310/328; 310/348
(58) Field of Classification Search .................. 310/348, 310/328
See application file for complete search history.

(56) References Cited

U.S. PATENT DOCUMENTS

| | | | |
|---|---|---|---|
| 5,305,507 A | 4/1994 | Dvorsky et al. | |
| 5,720,264 A * | 2/1998 | Oosuka et al. | 123/634 |
| 5,894,651 A | 4/1999 | Dvorsky et al. | |
| 5,920,145 A * | 7/1999 | Wu et al. | 310/328 |
| 6,316,863 B1 | 11/2001 | Schuh et al. | |
| 6,626,152 B1 * | 9/2003 | Deangelis et al. | 123/468 |
| 6,781,289 B2 | 8/2004 | Heinz et al. | |
| 7,024,737 B2 * | 4/2006 | Schuh et al. | 29/25.35 |
| 7,061,160 B2 * | 6/2006 | Leo et al. | 310/328 |
| 7,545,082 B2 | 6/2009 | Nakajima | |
| 2002/0046746 A1 * | 4/2002 | Nakabayashi et al. | 123/634 |
| 2005/0199745 A1 * | 9/2005 | Berlemont | 239/88 |
| 2007/0080076 A1 * | 4/2007 | Livache et al. | 205/792 |
| 2009/0304957 A1 | 12/2009 | Jamil et al. | |

FOREIGN PATENT DOCUMENTS

| | | |
|---|---|---|
| DE | 198 18 036 B4 | 11/1999 |
| DE | 100 42 734 C1 | 3/2002 |
| DE | 10 2006 026 247 A1 | 12/2006 |
| DE | 10 2006 025 177 A1 | 12/2007 |
| WO | WO 2007/128948 A1 | 11/2007 |

* cited by examiner

*Primary Examiner* — Jaydi San Martin
(74) *Attorney, Agent, or Firm* — Slater & Matsil, L.L.P.

(57) ABSTRACT

A piezoelectric actuator unit includes a piezoactuator and a casting compound enclosing the piezoactuator. The casting compound is disposed in a sleeve that includes a hydrophobic material.

14 Claims, 1 Drawing Sheet

PIEZOELECTRIC ACTUATOR UNIT INCLUDING A CASTING COMPOUND DISPOSED IN A SLEEVE

This application is a continuation of co-pending International Application No. PCT/DE2009/000006, filed Jan. 9, 2009, which designated the United States and was not published in English, and which claims priority to German Application No. 10 2008 003 821.0, filed Jan. 10, 2008, both of which applications are incorporated herein by reference.

TECHNICAL FIELD

A piezoactuator in a piezoelectric actuator unit having means for extending the service life thereof is disclosed.

BACKGROUND

Ways to protect a piezoactuator from environmental influences are significant if the service life of the piezoactuator is to be maintained as long as possible.

German patent document DE 102006025177 A1 discloses a piezoactuator located in a metal tube. A pressure transfer medium made of microporous or foam, mesh, or fabric elements is present between the metal tube and the piezoactuator.

SUMMARY

In various embodiments, a piezoactuator is protected from harmful environmental influences.

A piezoelectric actuator unit comprises a piezoactuator and a casting compound enclosing the piezoactuator. The casting compound is disposed in a sleeve comprising a hydrophobic material.

It has been determined experimentally that penetration of moisture in a piezoactuator can significantly decrease the service life thereof. The hydrophobic material of the sleeve of the actuator unit presented here has the advantage of keeping that moisture away from the piezoactuator. The proportion of hydrophobic material in the sleeve can be selected so high that no moisture or nearly no moisture can reach the piezoactuator.

The piezoactuator or the piezoelectrical multilayer component preferably comprises a stack of piezoceramic layers that can contain a PZT ceramic, and electrode layers preferably contain one of the following materials: silver, palladium, platinum, copper, or nickel.

Preferably, an external contact is applied to each of the two side faces of the stack. The external contacts can contain a material contained in the electrode layers. The external contacts can be designed as pins or as layers or series of layers. Each external contact contacts a stack of electrode layers, wherein the electrode layers of each stack contact the external contact with one end each, extending to the corresponding side faces of the stack.

According to one embodiment, the sleeve comprises a material undergoing bonding to the casting compound, whereby as few as possible hollow spaces arise between the casting compound and the sleeve.

It is preferred that the sleeve is made of materials that are chemically stable, such that they do not undergo any chemical reaction with at least one part of the piezoactuator, even if they were to diffuse from the sleeve to the corresponding part of the piezoactuator. Particularly preferable is that the hydrophobic material comprises the chemically stable property. Each external surface of a piezoceramic layer, as well as each surface of an external contact, is considered as at the least one part of the piezoactuator. The sleeve can thus be designed such that it does not contain any material undergoing a chemical reaction with a piezoceramic material or with an electrically conductive material of an external contact.

The proportion of hydrophobic material in the sleeve is preferably selected such that the sleeve has a maximum humidity absorption of 0.1% by weight to 0.3% by weight, preferably 0.2% by weight, at room temperature and a humidity of between 30 and 60%.

The sleeve preferably contains a material comprising a thermoplastic polyester, such as polybutylene terephthalate (PBT). It has been found that this material has hydrophobic properties, and simultaneously provides the sleeve with a sufficient mechanical strength or stability for stabilizing the shape of the casting compound and is resistant to temperatures that can occur, for example, in the engine compartment of a motor vehicle. Polybutylene terephthalate as the material contained in the sleeve further has the advantage that, due to its chemical stability, subsets thereof do not dissociate to the piezoactuator and chemically contaminate the piezoactuator.

According to one embodiment of the actuator unit, the sleeve comprises both hydrophobic material and a material reinforcing the mechanical strength of the sleeve, such as glass fiber. Glass fibers in the sleeve have the advantage of increasing the mechanical strength and the temperature resistance of the sleeve.

The glass fibers are preferably present in the sleeve at a proportion of 20% to 40% by weight, preferably 30% by weight.

The elastic modulus of the sleeve based on tensile stresses is preferably between 9000 MPa and 11000 MPa, preferably 10000 MPa. The breaking stress of the sleeve is preferably between 130 MPa and 140 MPa, preferably 135 MPa.

According to one embodiment of the actuator unit, the casting compound present between the piezoactuator and the sleeve comprises a material that does not decompose when in contact with a fuel, such as gasoline or diesel fuel, or the fuel has no corrosive effect on the material.

According to one embodiment, casting compound comprises a silicone elastomer.

The casting compound can contain additives, such as silica sand and/or a bonding agent. The bonding agent improves the adhesion of the casting compound on the outside of the piezoactuator and the inside of the sleeve.

According to one embodiment, the sleeve is injection molded.

BRIEF DESCRIPTION OF THE DRAWINGS

The subject matters described are explained in more detail using the following embodiment examples and figures, wherein.

Figure 1:
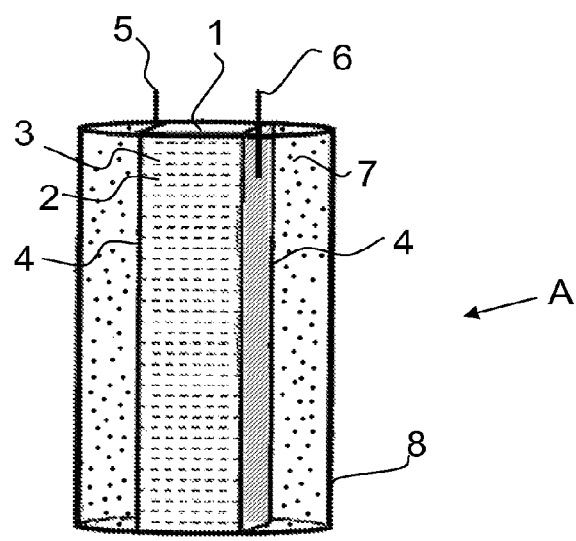
FIG. 1 provides a perspective view of an actuator unit.

The following list of reference numbers can be used in conjunction with the drawings.

A piezoelectric actuator unit
1 piezoactuator
2 piezoceramic layer
3 electrode layer
4 outer contact
5 first connection element
6 second, opposite-pole connection element 7 casting compound
8 sleeve

DETAILED DESCRIPTION OF ILLUSTRATIVE EMBODIMENTS

The actuator unit A shown in FIG. 1 comprises a piezoactuator 1 or piezoelectric multi-layer component enclosed by a casting compound 7, having a stack of piezoceramic layers 2 and electrode layers 3 disposed on top of each other. The electrode layers 3 form two stacks of electrode layers brought to different side faces of the stack, each contacting an outer contact 4 disposed at a corresponding side face of the stack. The outer contacts 4 are each connected to a connecting element 5, 6 configured as a wire or pin, permitting the piezoactuator 1 to be contacted electrically to the outside. The casting compound 7 preferably contains a silicone elastomer. In addition to the silicone elastomer, the casting compound 7 preferably contains a silica sand and bonding materials. The casting compound 7 is in contact with the outside of the piezoactuator; that is, with both the outer faces of the piezoceramic layers 2 and with the outer faces of the outer contacts 4. The casting compound 7 is externally confined by a sleeve 8. The height or length of the sleeve 8 corresponds approximately to the height of the piezoactuator 1. The sleeve 8 is made of polybutylene terephthalate and glass fiber, wherein the latter is present in the sleeve at a proportion of 30% by weight.

Figure 2A:
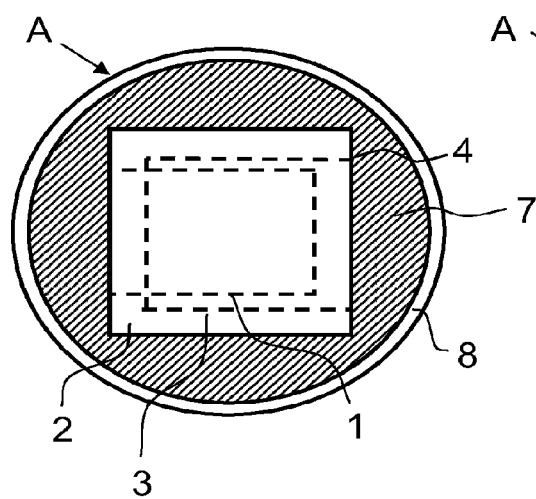
FIG. 2A illustrates a cross section of the actuator unit shown in FIG. 1.
Figure 2B:
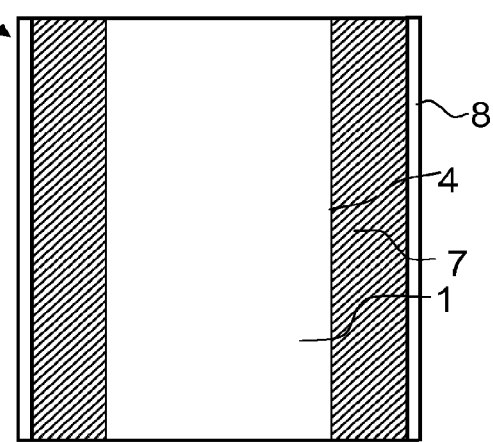
FIG. 2B illustrates a longitudinal section of the actuator unit shown in FIG. 1.

The actuator unit A presented in FIG. 1 is shown in the cross-sectional view according to FIG. 2a and the longitudinal sectional view according to FIG. 2b. Here it is shown how the perimeter of the piezoactuator 1, including outer contacts 4, and outer surfaces of piezoceramic layers 2 are enclosed by the casting compound 7. The casting compound is confined externally by the preferably cylindrical sleeve 8. FIG. 2a additionally shows the overlapping arrangement of opposite-pole rectangular electrode layers 3, each contacting a different outer contact 4.

What is claimed is:

1. A piezoelectric actuator unit, comprising:
   a piezoactuator; and
   a casting compound enclosing the piezoactuator, wherein the casting compound is disposed in a sleeve comprising a hydrophobic material and wherein the sleeve comprises a thermoplastic polyester.

2. The piezoelectric actuator unit according to claim 1, wherein the sleeve comprises a material undergoing bonding to the casting compound.

3. The piezoelectric actuator unit according to claim 2, whereby as few as possible hollow spaces arise between the casting compound and the sleeve.

4. The piezoelectric actuator unit according to claim 1, wherein the sleeve comprises a material that undergoes no chemical reaction with at least one part of the piezoactuator.

5. The piezoelectric actuator unit according to claim 1, wherein the sleeve comprises a material that undergoes no chemical reaction with the piezoactuator.

6. The piezoelectric actuator unit according to claim 1, wherein the thermoplastic polyester comprises polybutylene terephthalate.

7. The piezoelectric actuator unit according to claim 1, wherein the sleeve further comprises a material reinforcing mechanical stability of the sleeve.

8. The piezoelectric actuator unit according to claim 7, wherein the material reinforcing the mechanical stability of the sleeve comprises glass fibers.

9. The piezoelectric actuator unit according to claim 8, wherein the glass fibers are present in the sleeve at a proportion of between 20% and 40% by weight.

10. The piezoelectric actuator unit according to claim 1, wherein the casting compound comprises a silicone elastomer.

11. The piezoelectric actuator unit according to claim 1, wherein the casting compound comprises a silica sand.

12. The piezoelectric actuator unit according to claim 1, wherein the casting compound comprises a bonding agent.

13. The piezoelectric actuator unit according to claim 1, wherein the piezoactuator comprises a stack of piezoceramic layers and electrode layers.

14. The piezoelectric actuator unit according to claim 13, wherein electrical opposite-pole external contacts, each disposed at a side face of the stack, contact the electrode layers.

* * * * *